US006707919B2

(12) United States Patent
Koval et al.

(10) Patent No.: US 6,707,919 B2
(45) Date of Patent: Mar. 16, 2004

(54) DRIVER CONTROL CIRCUIT

(75) Inventors: John Koval, Santa Ana, CA (US); Christopher E. Combest, Leawood, KS (US)

(73) Assignee: Multi Service Corporation, Overland Park, KS (US)

( * ) Notice: Subject to any disclaimer, the term of this patent is extended or adjusted under 35 U.S.C. 154(b) by 628 days.

(21) Appl. No.: 09/742,950

(22) Filed: Dec. 20, 2000

(65) Prior Publication Data

US 2002/0076064 A1 Jun. 20, 2002

(51) Int. Cl.[7] .................................................. H03G 5/00
(52) U.S. Cl. ........................................ 381/100; 381/117
(58) Field of Search ................................ 381/100, 111, 381/116, 117, 98; 331/74, 77; 333/172, 167, 176

(56) References Cited

U.S. PATENT DOCUMENTS

| | | | |
|---|---|---|---|
| 1,931,235 | A | 10/1933 | Nicolson |
| 2,612,558 | A | 9/1952 | Klipsch |
| 2,802,054 | A | 8/1957 | Corney |
| 2,841,648 | A | 7/1958 | Thurston |
| 3,457,370 | A | 7/1969 | Boner |
| 3,657,480 | A | 4/1972 | Cheng et al. |
| 3,727,004 | A | 4/1973 | Bose |
| 3,816,765 | A | 6/1974 | Goyer |
| 3,838,215 | A | 9/1974 | Haynes, Jr. |
| 3,931,469 | A | 1/1976 | Elliott et al. |
| 3,984,635 | A | 10/1976 | Nestorovic et al. |
| 4,015,089 | A | 3/1977 | Ishii et al. |
| 4,031,321 | A | 6/1977 | Bakgaard |

(List continued on next page.)

FOREIGN PATENT DOCUMENTS

| | | |
|---|---|---|
| CA | 1148091 | 6/1982 |
| DE | 2910318 | 3/1979 |
| DE | 3347753 | 7/1983 |
| EP | 0050067 | 9/1981 |
| GB | 1254608 | 4/1969 |
| GB | 2064266 | 3/1980 |
| GB | 2095073 | 1/1982 |
| GB | 2126455 | 3/1983 |
| GB | 2145904 | 8/1983 |
| GB | 2163621 | 3/1985 |
| GB | 2159017 | 5/1985 |
| JP | 57113693 | 7/1982 |
| JP | 6271398 | 9/1985 |

OTHER PUBLICATIONS

Jim Brown—Impedance Matching—May 1985/Sound & Communications—p. 10, 11, & 15.

J. Wilkinson—Bookshelf Loudspeaker Improvements—Feb. 1982/Wireless World—p. 41.

*Primary Examiner*—Melur Ramakrishnaiah
(74) *Attorney, Agent, or Firm*—Hovey Williams LLP

(57) ABSTRACT

A driver control circuit (10) that enhances a steep crossover slope while permitting selective shaping or adjusting of its in-band frequency response with a minimum number of components. The driver control circuit includes a signal connector (16) for connecting with a source of audio signals (12); a speaker connector (18) for connecting with a speaker (14); and a frequency passing circuit (20) coupled between the signal connector (16) and the speaker connector (18) for passing a selected range of frequencies of the audio signals to the speaker (14) and for attenuating other frequencies. The frequency passing circuit (20) includes components forming a traditional low-pass or high-pass filter network and a resistive component (R1) connected in parallel across the second series mounted component of the low-pass or high-pass filter network.

17 Claims, 1 Drawing Sheet

U.S. PATENT DOCUMENTS

| | | | | |
|---|---|---|---|---|
| 4,037,051 | A | | 7/1977 | Fuselier |
| 4,074,070 | A | | 2/1978 | Gaus |
| 4,081,759 | A | | 3/1978 | Yen |
| 4,084,474 | A | | 4/1978 | Leslie |
| 4,100,371 | A | | 7/1978 | Bayliff |
| 4,128,738 | A | | 12/1978 | Gallery |
| 4,133,975 | A | | 1/1979 | Barker, III |
| 4,138,594 | A | | 2/1979 | Klipsch |
| 4,154,979 | A | | 5/1979 | Barker |
| 4,179,669 | A | | 12/1979 | Dodson et al. |
| 4,198,540 | A | | 4/1980 | Cizek |
| 4,229,618 | A | | 10/1980 | Gamble |
| 4,229,619 | A | | 10/1980 | Takahashi et al. |
| 4,237,340 | A | | 12/1980 | Klipsch |
| 4,238,744 | A | | 12/1980 | Iwahara |
| 4,243,840 | A | | 1/1981 | Kates |
| 4,249,042 | A | | 2/1981 | Orban |
| 4,282,402 | A | | 8/1981 | Liontonia |
| 4,287,389 | A | | 9/1981 | Gamble |
| 4,295,006 | A | | 10/1981 | Tanaka et al. |
| 4,315,102 | A | | 2/1982 | Eberbach |
| 4,340,778 | A | | 7/1982 | Cowans et al. |
| 4,348,549 | A | | 9/1982 | Berlant |
| 4,348,552 | A | | 9/1982 | Siccone |
| 4,349,697 | A | | 9/1982 | Skabla |
| 4,383,134 | A | | 5/1983 | von Recklinghausen |
| 4,410,063 | A | | 10/1983 | Yasue et al. |
| 4,421,949 | A | | 12/1983 | Eberbach |
| 4,426,552 | A | | 1/1984 | Cowans et al. |
| 4,429,181 | A | | 1/1984 | Freadman |
| 4,430,527 | A | | 2/1984 | Eberbach |
| 4,475,233 | A | | 10/1984 | Watkins |
| 4,483,015 | A | | 11/1984 | Strohbeen |
| 4,504,704 | A | * | 3/1985 | Ohyaba et al. ............ 381/117 |
| 4,578,809 | A | | 3/1986 | Eberbach |
| 4,583,245 | A | | 4/1986 | Gelow et al. |
| 4,589,135 | A | | 5/1986 | Baker |
| 4,593,405 | A | | 6/1986 | Frye et al. |
| 4,597,100 | A | | 6/1986 | Grodinsky et al. |
| 4,606,071 | A | | 8/1986 | White, Jr. |
| 4,638,505 | A | | 1/1987 | Polk et al. |
| 4,653,103 | A | | 3/1987 | Mori et al. |
| 4,691,362 | A | | 9/1987 | Eberbach |
| 4,723,289 | A | | 2/1988 | Schreiber et al. |
| 4,769,848 | A | | 9/1988 | Eberbach |
| 4,771,466 | A | | 9/1988 | Modafferi |
| 4,882,760 | A | | 11/1989 | Yee |
| 4,897,879 | A | | 1/1990 | Geluk |
| 5,109,423 | A | | 4/1992 | Jacobson et al. |
| 5,153,915 | A | | 10/1992 | Farella |
| 5,185,801 | A | | 2/1993 | Meyer et al. |
| 5,327,505 | A | | 7/1994 | Kim |
| 5,359,664 | A | | 10/1994 | Steuben |
| 5,373,563 | A | | 12/1994 | Kukurudza |
| 5,377,274 | A | | 12/1994 | Meyer et al. |
| 5,568,560 | A | | 10/1996 | Combest |
| 5,917,922 | A | * | 6/1999 | Kukurudza ................ 381/117 |

* cited by examiner

DRIVER CONTROL CIRCUIT

BACKGROUND OF THE INVENTION

1. Field of the Invention

The present invention relates to driver control circuits for controlling audio speakers. More particularly, the invention relates to a driver control circuit that optimally controls the frequencies of audio signals delivered to one or more speakers using a minimum number of components.

2. Description of the Prior Art

Driver control circuits divide audio signals into different frequency bands or ranges for controlling two or more speakers or "drivers" in a speaker system. Driver control circuits apportion the frequency spectrum in such a way that each speaker operates in its optimum frequency range and the entire speaker system reproduces sound with a minimum of distortion.

The frequency at which a driver control circuit separates one frequency band from an adjacent band is called the crossover frequency. A driver control circuit passes a selected frequency range or band of signals to each speaker and attenuates frequencies that are beyond the speakers' crossover frequency. In this way, each speaker reproduces audio signals only in its optimum frequency range and then "rolls off" beyond the crossover frequency.

The rate at which a driver control circuit attenuates frequencies delivered to a speaker beyond the crossover frequency is called the crossover slope. Crossover slopes are measured in dB of attenuation per octave and are categorized by their magnitude or "steepness".

Driver control circuits with steep crossover slopes are desirable because they attenuate frequencies that are beyond a speaker's effective operating range more rapidly so that the speaker audibly reproduces only audio signals in its optimum frequency range, reducing distortion from signals outside the range. Steep crossover slopes are also desirable because they allow the operating ranges of the speakers to be extended and reduce or eliminate interference between speakers operating at adjacent frequency ranges.

In addition to constructing driver control circuits with steep crossover slopes, it is also often desirable to select or shape the frequency response of a driver control circuit above or below its crossover frequency. Such frequency shaping or selecting is especially desirable for audio speakers used in home theater systems where sound is reproduced by a plurality of different types of speakers including, for example, left and right main speakers, a center channel speaker, left and right surround speakers, and a low-frequency effects sub-woofer speaker. Because each speaker or speaker pair in a home theater system should optimally reproduce only certain frequencies of audio signals, it is important to carefully select the crossover frequencies of all of the speakers and to shape the frequency response of the speakers using the driver control circuits. It is often even desirable to adjust the frequency response of each type of speaker using the driver control circuits so that the sound from the different types of speakers match as perfectly as possible.

Applicant has discovered that home theater speaker operation can often be optimized if the frequency response of the driver control circuits for the speakers can be selectively shaped or adjusted above and below the speakers' crossover frequencies to match all the speakers. Such selective adjustment of the frequency response allows home theater system designers and installers to custom-configure home theater systems to achieve extremely high-quality sound.

Many solutions exist in the prior art to shape or select the frequency responses and crossover frequencies of driver control circuits. However, prior art solutions require the addition of a plurality of inductors, capacitors, and other electronic components to existing filter networks, thus significantly increasing the size and cost of the driver control circuits. In addition, in-wall units required in many home theater applications do not have space for such components.

SUMMARY OF THE INVENTION

The present invention solves the above-described problems and provides a distinct advance in the art of driver control circuits. More particularly, the present invention provides a driver control circuit that enhances a steep crossover slope while permitting selective shaping or adjusting of its in-band frequency response near its crossover frequency with a minimum number of components.

One embodiment of the driver control circuit of the present invention broadly includes a signal connector for connecting with a source of audio signals; a speaker connector for connecting with a speaker; and a frequency passing circuit coupled between the signal connector and the speaker connector for passing a selected range of frequencies of the audio signals to the speaker and for attenuating other frequencies. The frequency passing circuit includes components forming a traditional low-pass and/or high-pass filter network and a resistive component connected in parallel across the second series mounted component of the low-pass and/or high-pass filter network.

The resistive component increases the crossover slope of the driver control circuit and shapes its in-band frequency response near the crossover frequency. By selectively adjusting the resistance value of the resistive component, the frequency response and crossover frequencies of the driver control circuit can be optimally selected or adjusted for use in home theater systems and other applications requiring precise frequency shaping between multiple types of speakers.

These and other important aspects of the present invention are described more fully in the detailed description below.

BRIEF DESCRIPTION OF THE DRAWING FIGURES

A preferred embodiment of the present invention is described in detail below with reference to the attached drawing figures, wherein.

Figure 1:
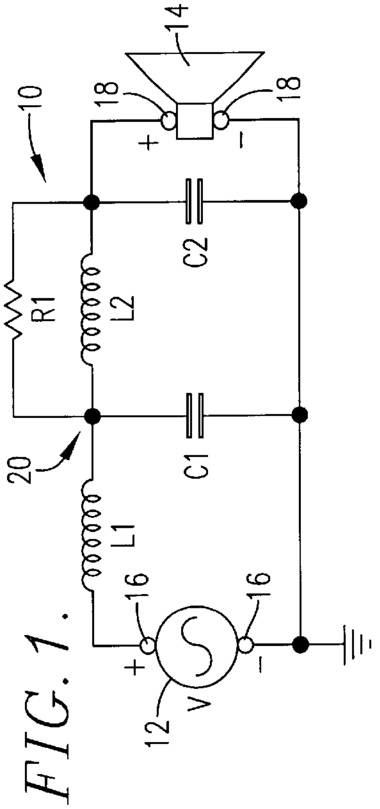
FIG. 1 is a schematic diagram of a driver control circuit constructed in accordance with a first preferred embodiment of the present invention.

The drawing figures do not limit the present invention to the specific embodiments disclosed and described herein. The graphs are not necessarily to scale, emphasis instead being placed upon clearly illustrating the principles of the invention.

DETAILED DESCRIPTION OF THE PREFERRED EMBODIMENTS

Turning now to the drawing figures, and particularly FIG. 1, a driver control circuit 10 constructed in accordance with a first preferred embodiment of the invention is illustrated. The driver control circuit 10 is operable for receiving audio signals from an audio signal source 12 and for driving an audio speaker 14 or other driver with certain frequencies of the audio signals. The driver control circuit 10 broadly includes signal connectors 16 for connecting with the audio signal source 12, speaker connectors 18 for connecting with the speaker 14, and a frequency passing circuit 20 coupled between the signal connectors 16 and the speaker connectors 18.

The audio signal source 12 may be any conventional source of audio signals such as a stereo receiver, DVD player, home theater processor, VCR, or other audio/visual component. The signal connectors 16 may be any conventional input terminals or connectors for connecting with the audio signal source 12.

In the embodiment illustrated in FIG. 1, the speaker 14 is preferably a "woofer" or mid-range type speaker that reproduces low or mid-frequency audio signals. The speaker 14 is conventional and may be manufactured by any known speaker maker such as Induction Dynamics, Bose, Pioneer, Velodyne, or Sony. The speaker connectors 18 may be any conventional output terminals or connectors configured for coupling with the speaker 14.

The frequency passing circuit 20 is electrically connected between the signal connectors 16 and the speaker connectors 18 and is provided for passing a selected range of frequencies of the audio signals from the audio signal source 12 to the speaker 14 and for attenuating other frequencies. In the embodiment illustrated in FIG. 1, the frequency passing circuit 20 preferably forms a low-pass filter network that passes low-frequency range audio signals to the speaker 14 and attenuates other frequencies.

The frequency passing circuit 20 preferably includes a first inductor L1, a second inductor L2, a first capacitor Cl, and a second capacitor C2. The inductors L1 and L2 are coupled in series between the signal connectors 16 and the speaker connectors 18. Inductors L1 and L2 are preferably low resistance coils, and their values may be selected to achieve any desired low-pass frequency response. In one embodiment, the inductors L1 and L2 have values of 2.3 mH and 1.15 mH, respectively.

The capacitor C1 is coupled in shunt or parallel between the junction of the inductors L1 and L2, and the capacitor C2 is coupled in shunt or parallel between the inductor L2 and the speaker connectors 18. As with the inductors L1 and L2, the capacitors C1 and C2 may have any values to achieve any low-pass frequency response. In one embodiment, the capacitors C1 and C2 have values of approximately 31 uF and 6.5 uF, respectively.

The inductors L1 and L2 and the capacitors C1 and C2 cooperate for passing low range frequencies of the audio signals from the audio signal source 12 to the speaker 14 and for attenuating other frequencies at a rate of approximately 24 dB/octave. With the specific values described above, the frequency passing circuit 20 has a low-pass crossover frequency of approximately 1000 Hz. Those skilled in the art will appreciate that the crossover frequency can be varied by selecting different values for the inductors L1 and L2 and/or the capacitors C1 and C2.

In accordance with one important aspect of the present invention, the frequency passing circuit 20 also includes a resistor R1 that is coupled in parallel across the second series component, in this embodiment, the inductor L2. The resistor R1 preferably has a value between 1–100 ohms. The resistor R1 allows the frequency response and the crossover frequency of the frequency passing circuit 20 to be selectively adjusted to achieve optimal operating results. The resistor R1 is especially useful for shaping the frequency response of the driver control circuit 10 below its crossover frequency as described in more detail below.

Figure 2:
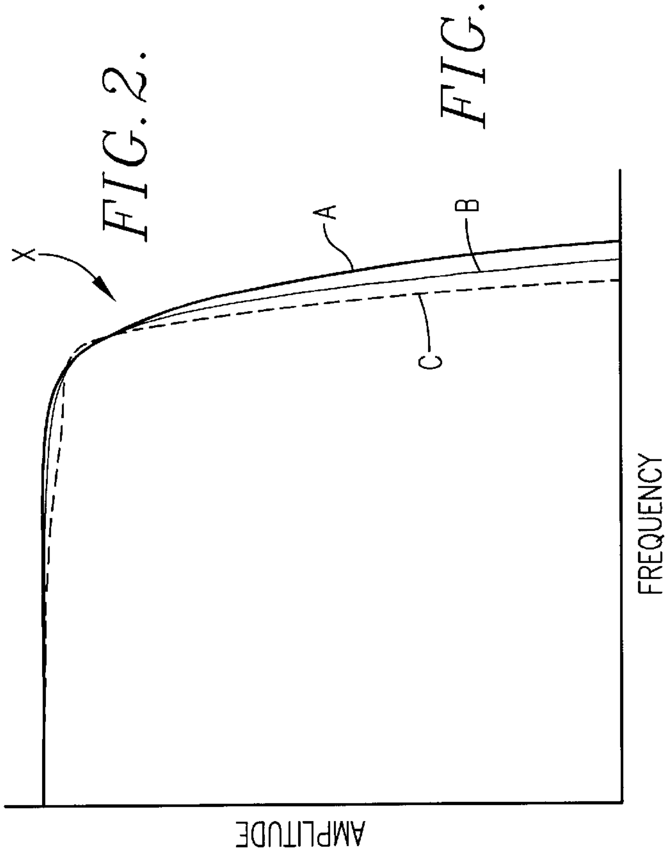
FIG. 2 is a graph illustrating the frequency response of the driver control circuit of FIG. 1 for several different resistive values.

FIG. 2 illustrates the frequency response of the driver control circuit 10 for different resistive values for resistor R1. The approximate crossover frequency of the driver control circuit is identified by the letter "X". The curve identified with the letter "A" represents the frequency response of the driver control circuit 10 when resistor R1 has a resistive value approaching infinity. For typical circuit values, there is no noticeable effect on the driver control circuit 10 when R1 has an infinite resistance. Curve A demonstrates that the driver control circuit 10 passes low-frequency audio signals to the speaker 14 and then rapidly attenuates all frequencies exceeding the crossover frequency. Curve A is therefore typical of the frequency response for a conventional low-pass filter.

The curve identified by the letter "B" represents the frequency response of the driver control circuit 10 when resistor R1 has a value of approximately 40 ohms. Lowering the resistance of R1 changes the frequency response of the driver control circuit 10 in three primary ways. First, the driver control circuit 10 begins attenuating higher frequency signals slightly earlier than it did when the resistor R1 had infinite resistance as evidenced by the in-band dip of curve B before the crossover frequency. Second, the driver control circuit 10 continues to pass low-frequency audio signals up to the crossover frequency as evidenced by the fact that curve B momentarily intersects curve A just below the crossover frequency. Third, the driver control circuit 10 more rapidly attenuates the higher frequency out of band audio signals as evidenced by the fact that curve B is steeper than curve A at frequencies higher than the crossover frequency. The net effect of lowering the resistance of R1 is therefore to increase the crossover slope of the driver control circuit 10 and to permit selective shaping of the in-band frequency response of the driver control circuit 10 near the crossover frequency. Applicant has discovered that such frequency response shaping is desirable in many home theater applications as well as any quality speaker system designs.

The curve identified by the letter "C" represents the frequency response of the driver control circuit 10 when resistor R1 has a value of approximately 10 ohms. In general, the characteristics of curve C are merely exaggerations of the same characteristics of curve B. Specifically, lowering the resistance of R1 causes the driver control circuit 10 to begin attenuating higher frequency signals slightly earlier and to achieve a steeper crossover slope.

Applicant has discovered that is it desirable in some home theater applications to vary the resistance of R1 until the optimal frequency response for the driver control circuit 10 is obtained.

Figure 3:
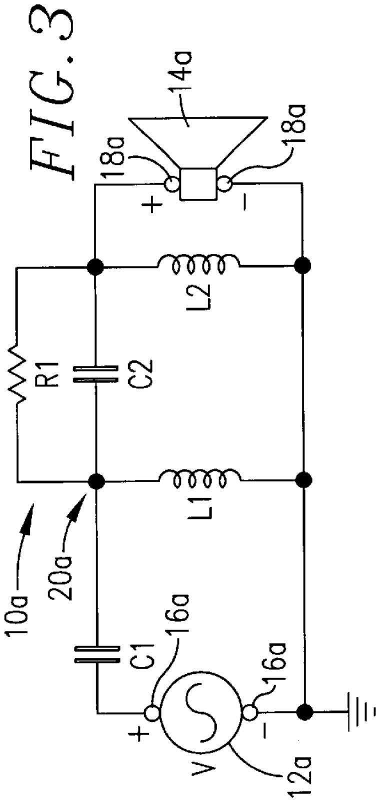
FIG. 3 is a schematic diagram of a driver control circuit constructed in accordance with a second preferred embodiment of the present invention.

FIG. 3 illustrates a driver control circuit 10A constructed in accordance with a second preferred embodiment of the present invention. The driver control circuit 10A is similar to the driver control circuit 10 illustrated in FIG. 1; therefore, like components are identified with the same numbering scheme followed by the letter "a".

The speaker 14*a* for the second embodiment is preferably a midrange or high-frequency tweeter-type speaker that reproduces mid or higher frequency audio signals. The speaker 14*a* is conventional and may be manufactured by any known speaker maker such as Induction Dynamics, Bose, Pioneer, Velodyne, or Sony.

The frequency passing circuit 20*a* is similar to the frequency passing circuit 20 illustrated in FIG. 1 except that the circuit 20*a* is configured to operate as a high-pass filter network that passes high-frequency range audio signals to the speaker 14*a* and attenuates other frequencies.

The frequency passing circuit 20*a* preferably includes a first capacitor C1, a second capacitor C2, a first inductor L1, and a second inductor L2. The capacitor C1 and C2 are coupled in series between the signal connector 16*a* and the speaker connector 18*a*. The capacitors C1 and C2 may have any values to achieve any high-pass frequency response. In one embodiment, the capacitors C1 and C2 have values of approximately 10.5 uf and 21 uf, respectively.

The inductor L1 is coupled in shunt or parallel between the junction of the capacitor C1 and C2, and the inductor L2 is coupled in shunt or parallel between the capacitor C2 and the speaker connectors 18*a*. The inductors L1 and L2 may have any values to achieve any high-pass frequency response. In one embodiment, the inductors L1 and L2 have values of approximately 0.8 mH and 3.6 mH, respectively.

The capacitors C1 and C2 and the inductors L1 and L2 cooperate to pass high-range frequencies of the audio signals from the audio signal source 12*a* to the speaker 14*a* and for attenuating other frequencies at a rate of approximately 24 db per octave. With the specific values described above, the frequency passing circuit 20*a* has a high-pass crossover frequency of approximately 1000 Hz. Those skilled in the art will appreciate that the crossover frequency can be varied by selecting different values for the capacitors C1 and C2 and/or the inductors L1 and L2.

In accordance with one important aspect of the present invention, the frequency passing circuit 20*a* also includes a resistor R1 that is coupled in parallel across the second series-mounted component, in this embodiment, the capacitor C2. The resistor R1 preferably has a value between 1–100 ohms. The resistor R1 allows the frequency response of the frequency passing circuit 20*a* to be selectively adjusted to achieve optimal operating results. The resistor R1 is especially useful for shaping the frequency response of the driver control circuit 10 above its crossover frequency as described in more detail below.

Figure 4:
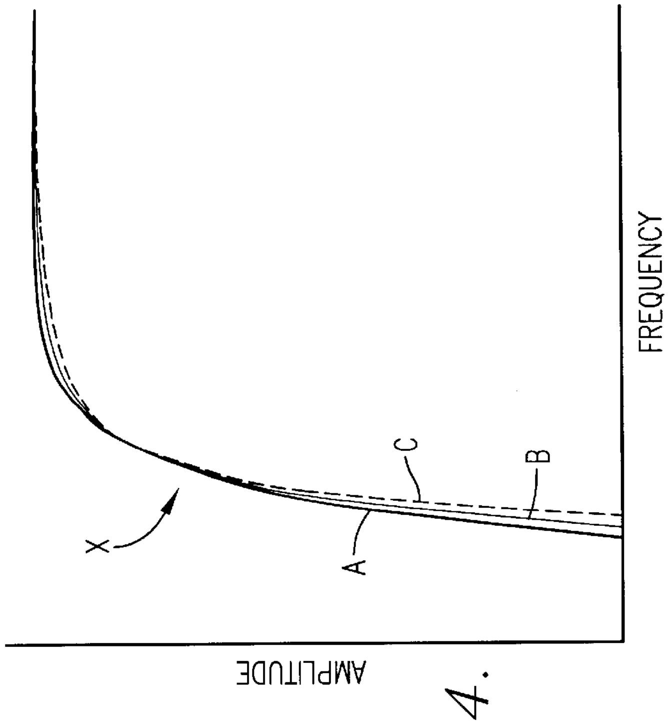
FIG. 4 is a graph illustrating the frequency response of the driver control circuit of FIG. 3 for several different resistive values.

FIG. 4 illustrates the frequency response of the driver control circuit 10*a* for different resistive values for resistor R1. The approximate crossover frequency of the driver control circuit 10*a* is identified by the letter "X". The curve identified with the letter "A" represents the frequency response of the driver control circuit 10*a* when resistor R1 has a resistive value approaching infinity. For typical circuit values, there is no noticeable effect on the driver control circuit 10*a* when R1 has an infinite resistance. Curve A demonstrates that the driver control circuit 10*a* passes high-frequency audio signals to the speaker 14*a* and then rapidly attenuates all frequencies below the crossover frequency. Curve A is therefore typical of the frequency response for a conventional high-pass filter.

The curve identified by the letter "B" represents the frequency response of the driver control circuit 10*a* when resistor R1 has a value of approximately 40 ohms. Lowering the resistance of R1 changes the frequency response of the driver control circuit 10*a* in three primary ways. First, the driver control circuit 10*a* begins attenuating the lower frequency in-band signals slightly earlier than it did when the resistor R1 had infinite resistance as evidenced by the in-band dip of curve B above the crossover frequency. Second, the driver control circuit 10*a* continues to pass high-frequency audio signals up to the crossover frequency as evidenced by the fact that curve B momentarily intersects curve A just above the crossover frequency. Third, the driver control circuit 10*a* more rapidly begins to attenuate lower frequency audio signals below the crossover frequency as evidenced by the fact that curve B is steeper than curve A below the crossover frequency. The net effect of lowering the resistance of R1 is therefore to increase the crossover slope of the driver control circuit 10*a* and to permit selective shaping of the in-band frequency response of the driver control circuit 10*a* near the crossover frequency. Applicant has discovered that such frequency response shaping is desirable in many home theater applications as well as any quality speaker system designs.

The curve identified by the letter "C" represents the frequency response of the driver control circuit 10*a* when resistor R1 has a value of approximately 10 ohms. In general, the characteristics of curve C are merely exaggerations of the same characteristics of curve B. Specifically, lowering the resistance of R1 causes the driver control circuit 10 to begin attenuating lower frequency signals slightly earlier and to achieve a steeper crossover slope.

Applicant has discovered that is it desirable to vary the resistance of R1 until the optimal frequency response for the driver circuit 10*a* is obtained.

Although the invention has been described with reference to the preferred embodiment illustrated in the attached drawing figures, it is noted that equivalents may be employed and substitutions made herein without departing from the scope of the invention as recited in the claims. For example, the driver control circuit 10 illustrated in FIG. 1 and the driver control circuit 10*a* illustrated in FIG. 3 may be combined and also supplemented with other frequency passing circuits in a single circuit or device for driving several speakers in a multi-speaker system.

Having thus described the preferred embodiment of the invention, what is claimed as new and desired to be protected by Letters Patent includes the following:

What is claimed is:

1. A driver control circuit for driving a speaker, the driver control circuit comprising:

a signal connector for connecting with a source of audio signals;

a speaker connector for connecting with the speaker; and a frequency passing circuit coupled between the signal connector and the speaker connector for passing a selected range of frequencies of the audio signals to the speaker and for attenuating other frequencies, the frequency passing circuit including a first series-coupled component connected between the signal connector and the speaker connector, a second series-coupled component connected in series with the first series-coupled component between the signal connector and the speaker connector, a first parallel-coupled component connected in parallel between the first series-coupled component and the second series-coupled component, a second parallel-coupled component connected in parallel between the second series-mounted component and the speaker connector, and a resistive component connected in parallel across the second series-mounted component.

2. The driver control circuit as set forth in claim 1, wherein the speaker is a low or mid-frequency speaker.

3. The driver control circuit as set forth in claim 2, wherein the frequency passing circuit is a low-pass filter for passing low-frequency range audio signals to the speaker and for attenuating other frequencies.

4. The driver control circuit as set forth in claim 3, wherein the first series-coupled component is an inductor.

5. The driver control circuit as set forth in claim 3, wherein the second series-coupled component is an inductor.

6. The driver control circuit as set forth in claim 3, wherein the first parallel-coupled component is a capacitor.

7. The driver control circuit as set forth in claim 3, wherein the second parallel-coupled component is a capacitor.

8. The driver control circuit as set forth in claim 3, wherein the resistive component is a resistor.

9. The driver control circuit as set forth in claim 1, wherein the speaker is a mid or high-frequency speaker.

10. The driver control circuit as set forth in claim 9, wherein the frequency passing circuit is a high-pass filter for passing high-frequency range audio signals to the speaker and for attenuating other frequencies.

11. The driver control circuit as set forth in claim 10, wherein the first series-coupled component is a capacitor.

12. The driver control circuit as set forth in claim 10, wherein the second series-coupled component is a capacitor.

13. The driver control circuit as set forth in claim 10, wherein the first parallel-coupled component is an inductor.

14. The driver control circuit as set forth in claim 10, wherein the second parallel-coupled component is an inductor.

15. The driver control circuit as set forth in claim 10, wherein the resistive component is a resistor.

16. A speaker assembly comprising a signal connector for connecting with a source of audio signals;

a speaker; and a frequency passing circuit coupled between the signal connector and the speaker for passing a selected range of frequencies of the audio signals to the speaker and for attenuating other frequencies, the frequency passing circuit including a first series-coupled component connected between the signal connector and the speaker connector, a second series-coupled component connected in series with the first series-coupled component between the signal connector and the speaker connector, a first parallel-coupled component connected in parallel between the first series-coupled component and the second series-coupled component, a second parallel-coupled component connected in parallel between the second series-mounted component and the speaker connector, and a resistive component connected in parallel across the second series-mounted component.

17. A driver control circuit for driving a speaker, the driver control circuit comprising:

a signal connector for connecting with a source of audio signals;

a speaker connector for connecting with the speaker; and a frequency passing circuit coupled between the signal connector and the speaker connector for passing a selected range of frequencies of the audio signals to the speaker and for attenuating other frequencies, the frequency passing circuit including a first series-coupled component connected between the signal connector and the speaker connector, a second series-coupled component connected in series with the first series-coupled component between the signal connector and the speaker connector, a first parallel-coupled component connected in parallel between the first series-coupled component and the second series-coupled component, and a resistive component connected in parallel across the second series-mounted component.

* * * * *